United States Patent [19]

Falco

[11] 4,362,023

[45] Dec. 7, 1982

[54] THERMOELECTRIC REFRIGERATOR HAVING IMPROVED TEMPERATURE STABILIZATION MEANS

[75] Inventor: Charles M. Falco, Woodridge, Ill.

[73] Assignee: The United States of America as represented by the United States Department of Energy, Washington, D.C.

[21] Appl. No.: 287,965

[22] Filed: Jul. 29, 1981

[51] Int. Cl.$^3$ ............................................. F25B 21/02
[52] U.S. Cl. ....................................................... 62/3
[58] Field of Search ................................................ 62/3

[56] References Cited

U.S. PATENT DOCUMENTS

| | | | |
|---|---|---|---|
| 2,921,973 | 1/1960 | Heikes et al. | 62/3 X |
| 3,009,977 | 11/1961 | Houston | 62/3 X |
| 3,070,644 | 12/1962 | Grinten et al. | 62/3 X |
| 3,090,207 | 5/1963 | Smith et al. | 62/3 |
| 3,159,979 | 12/1964 | Anders | 62/3 |
| 3,229,469 | 1/1966 | Katon | 62/3 |
| 3,261,721 | 7/1966 | Cornish | 62/3 X |
| 3,902,923 | 9/1975 | Evans | 62/3 X |

*Primary Examiner*—Lloyd L. King
*Attorney, Agent, or Firm*—Bruce R. Mansfield; Paul A. Gottlieb; Richard G. Besha

[57] ABSTRACT

A control system for thermoelectric refrigerators is disclosed. The thermoelectric refrigerator includes at least one thermoelectric element that undergoes a first order change at a predetermined critical temperature. The element functions as a thermoelectric refrigerator element above the critical temperature, but discontinuously ceases to function as a thermoelectric refrigerator element below the critical temperature. One example of such an arrangement includes thermoelectric refrigerator elements which are superconductors. The transition temperature of one of the superconductor elements is selected as the temperature control point of the refrigerator. When the refrigerator attempts to cool below the point, the metals become superconductors losing their ability to perform as a thermoelectric refrigerator. An extremely accurate, first-order control is realized.

8 Claims, 5 Drawing Figures

THERMOELECTRIC REFRIGERATOR HAVING IMPROVED TEMPERATURE STABILIZATION MEANS

CONTRACTUAL ORIGIN OF THE INVENTION

The U.S. Government has rights in this invention pursuant to Contract No. W-31-109-ENG-38 between the U.S. Department of Energy and Argonne National Laboratory.

BACKGROUND OF THE INVENTION

This invention pertains to thermostat arrangements for thermoelectric refrigerators, and in particular to thermostat arrangements having a first order response characteristic. Thermoelectric refrigerator devices have found wide acceptance in a variety of applications including miniature electronic circuits, temperature controls, and medical and laboratory instrumentation. Frequently, it is required to maintain the temperature of an object to be cooled within close tolerances. One such requirement arises in the superconducting electronic art, where thermal noise of very sensitive electronic devices is a limiting design and operation factor. Conventional temperature regulation systems include open loop, and feedback control systems. The open loop system typically contains a transformer and rectifiers, while feedback systems typically contain thermistors which sense the temperature of the control junction of the thermoelectric refrigerator device. While the feedback systems offer closer temperature regulation and faster response times than the open loop control systems, superior control systems are needed. In particular, no first order control systems, i.e. those systems in which the first derivative of the control current with respect to temperature is infinite, are known. Such control is especially needed for superconducting microelectronics such as superconducting quantum interference devices, where Johnson or thermal noise of the microelectronic devices is proportional to the temperature fluctuation of the device.

It is therefore an object of the present invention to provide a thermostat arrangement for superconductor devices having improved temperature regulation and response time.

Another object of the present invention is to provide a thermoelectric refrigerator with a thermostat arrangement having a first order response characteristic, one in which the first derivative of the thermoelectric property with respect to temperature is infinite.

Additional objects, advantages and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

These and other objects of the present invention are provided by a control system for thermoelectric refrigerators of the type formed of materials having a first order transition in a physical property of the material which allows the material to function as a thermoelectric refrigerator. One example of such an arrangement is a thermoelectric refrigerator comprising semiconducting superconductor material, having a first order change in conductivity at their critical temperatures, $T_c$ of the superconductor. A $Nb_3Ge$ superconductor and a $Nb_3Sn$ superconductor with different superconducting transition temperatures $T_c$ are maintained in a cryogenic environment, connected electrically in series, and thermally in parallel. The electrical connection between the two superconductors forms a cold junction, and the free ends the superconductors form a hot junction. A direct current electrical source is applied to the free ends of the superconductors, and a steady electrical current is passed therethrough, as is known in the thermoelectric refrigerator art. The lower $T_c$ superconductor, a metal, is constructed so as to have a predetermined critical or transition temperature, below which the metal becomes a superconductor. When one of the metals is operated in a superconducting state, the arrangement discontinuously decreases in stability to function as a thermoelectric refrigerator. When both metals are operated in the superconducting state, the arrangement ceases to function as a thermoelectric refrigerator, no longer generating thermal power. Thus, the thermolelectric refrigerator is regulated about the transition temperature of the lower $T_c$ $Nb_3Sn$ superconductor.

DESCRIPTION OF THE PREFERRED EMBODIMENT

Figure 1:
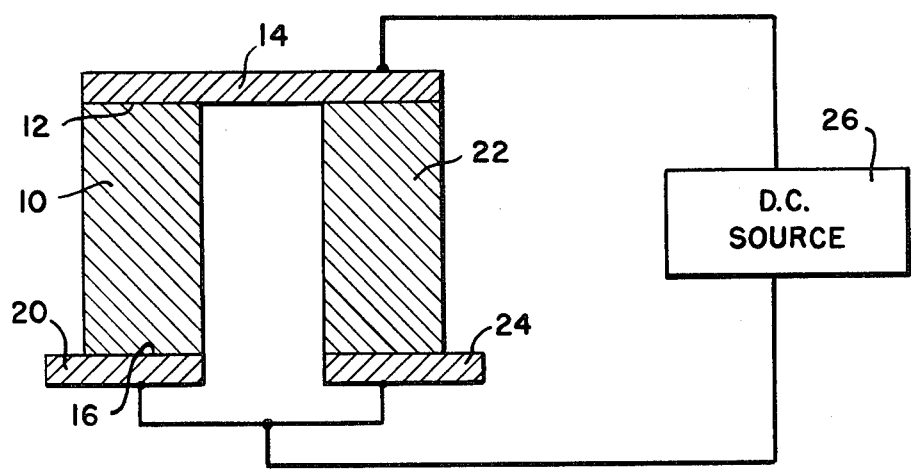
FIG. 1 is a schematic representation of a thermoelectric refrigerator and control device according to the invention.

Referring to the drawings, the preferred embodiment of the invention comprises a superconducting thermoelectric refrigerator. The numeral 10 is applied to the lower $T_c$ semiconductor - superconductor element, preferably formed of $Nb_3Sn$. The term semiconductor is used only to refer to materials which can form a thermoelectric refrigerator. Element 10 has a first end 12 thermally connected to a cold junction 14 which is formed of metal or other suitable thermoconductor material. A second end 16 of element 10 is thermally connected to junction 20. A higher $T_c$ semiconductor-superconductor element 22, preferably formed of $Nb_3Ge$, is connected at one end to cold junction 14 and is connected at the other end to junction 24. A direct current source 26 is electrically connected between junctions 20, 24, and a steady electrical current is maintained through elements 10, 22 as is known in the thermoelectric refrigerator art. Cold junction 14 electrically interconnects elements 10, 22 and provides thermal connection to the system to be refrigerated. Junctions 20, 24 together form a hot junction which provides thermal connection to a heat sink, not shown in FIG. 1. The electrical carriers in elements 10, 22 move heat energy from cold junctions 14 to hot junctions 20, 24 when a current is passed through elements 10, 22 under the electromotive force of source 26. Elements 10, 22 are maintained in a cryogenic environment, such as that provided by envelope 30. Envelope 30, formed of cryogenic thermal insulating material, is filled with a cryogen 32, such as liquid helium or is maintained at low temperatures using a closed-cycle refrigerator. Envelope 30 maintains a thermal insulation between elements 10, 22 and junctions 14, 20, and 24.

Elements 10, 22 are superconducting below their respective critical or transition temperatures. When superconducting, the thermal power in the element drops to zero due to the macroscopic quantum nature of a superconductor. An energy gap develops in the superconductor at $T_c$ and the charge carriers in the superconductor have no thermoelectric power. Above its transition temperature, the superconductor element becomes "normal" and the thermal power generated by the elements become finite. The elements 10, 22 need not both be superconducting to interrupt the thermoelectric cooling of the refrigerator. Of the two elements 10, 22, the former element, formed of $Nb_3Ge$, is designed to have a higher transition temperature. Thus, above the transition temperature of the $Nb_3Ge$ element 10, both elements 10, 22 are "normal" and generate thermal power. When the cold junction is cooled to the transition temperature of element 10, that element ceases to generate thermal power. Since the thermal power generated by element 22 is negligible below 17° K., the thermoelectric refrigerator is turned "off" when the temperature of the cold junction falls below the transition temperature of element 10. Thus, if the transition temperature of the $Nb_3Sn$ element 10 is below 17° K., reliable temperature stabilization will be provided by the arrangement of FIG. 1. This temperature control is extremely fast and accurate, owing to the first order superconductor transition phenomenon involved. For example, at an 18° K. transition temperature, regulation is within 0.001° K., or one part in 18,000. Thus, the temperature stabilization device of this invention is especially suited for cryogenic microelectronics, particularly those electronics extremely sensitive to Johnson, or thermal noise.

The figure of merit, Z, for a thermoelectric refrigerator is:

$$Z = \frac{(\alpha_2 - \alpha_1)^2}{[(k_1 P_1)^{\frac{1}{2}} + (k_2 P_2)^{\frac{1}{2}}]}$$

where
$\alpha_1$ = thermopower in Volts/°K.
$k_1$ = thermal conductivity in Watts/cm−°K.
$p_1$ = resistivity in ohm-cm
In the superconducting state, $\alpha = 0$.

The maximum temperature difference obtainable from such a refrigerator is:

$$(T_{hot} - T_{cold})_{max} = \tfrac{1}{2} Z\, T_{cold}^2$$

or $$T_{cold} = \frac{(1 + 2\,Z\,T_{hot})^{\frac{1}{2}} - 1}{Z}$$

Figure 2:
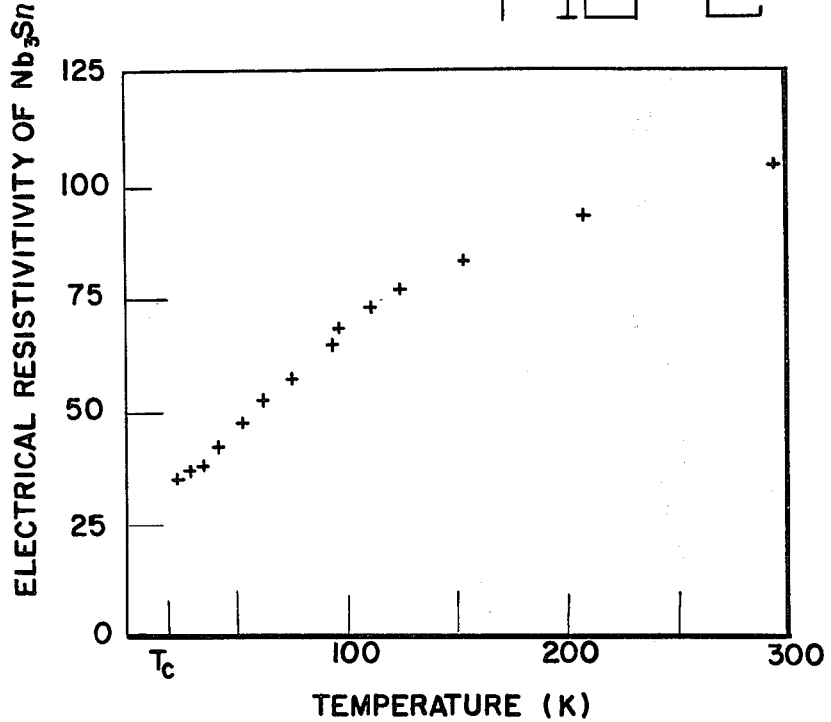
FIG. 2 shows the plot of electrical resistivity of $Nb_3Sn$ versus temperature.
Figure 3:
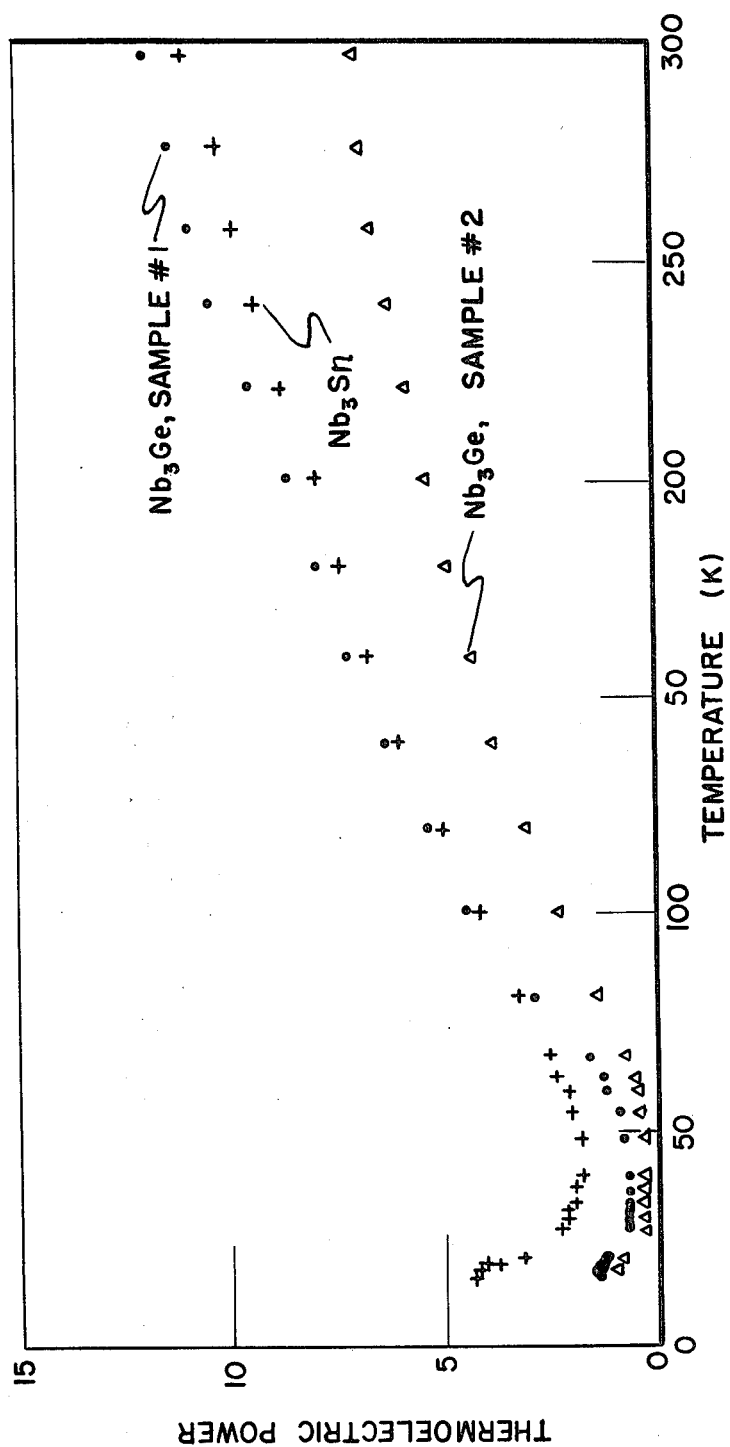
FIG. 3 shows a plot of thermoelectric power versus temperature for two samples of $Nb_3Ge$ and one sample of $Nb_3Sn$ thin films.
Figure 4:
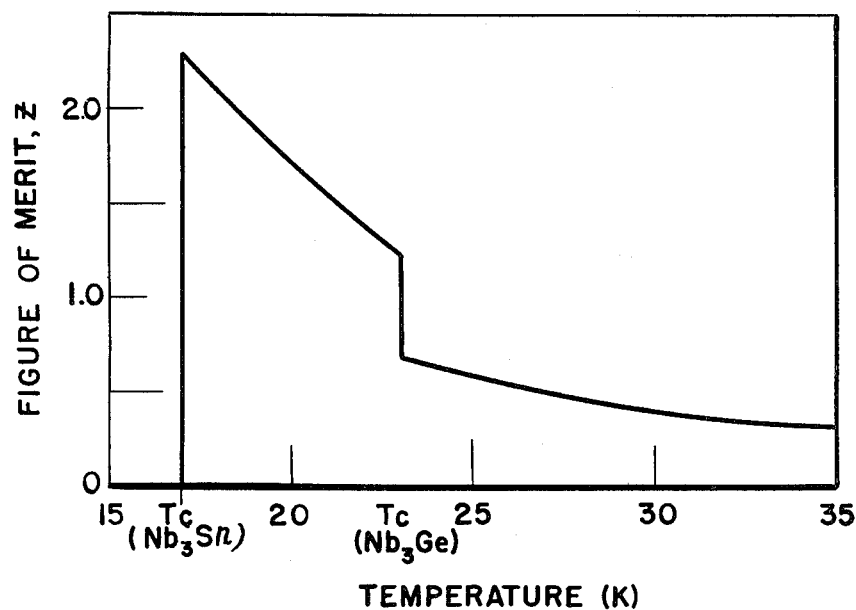
FIG. 4 shows the range of figures of merit of a thermoelectric refrigerator according to the invention.
Figure 5:
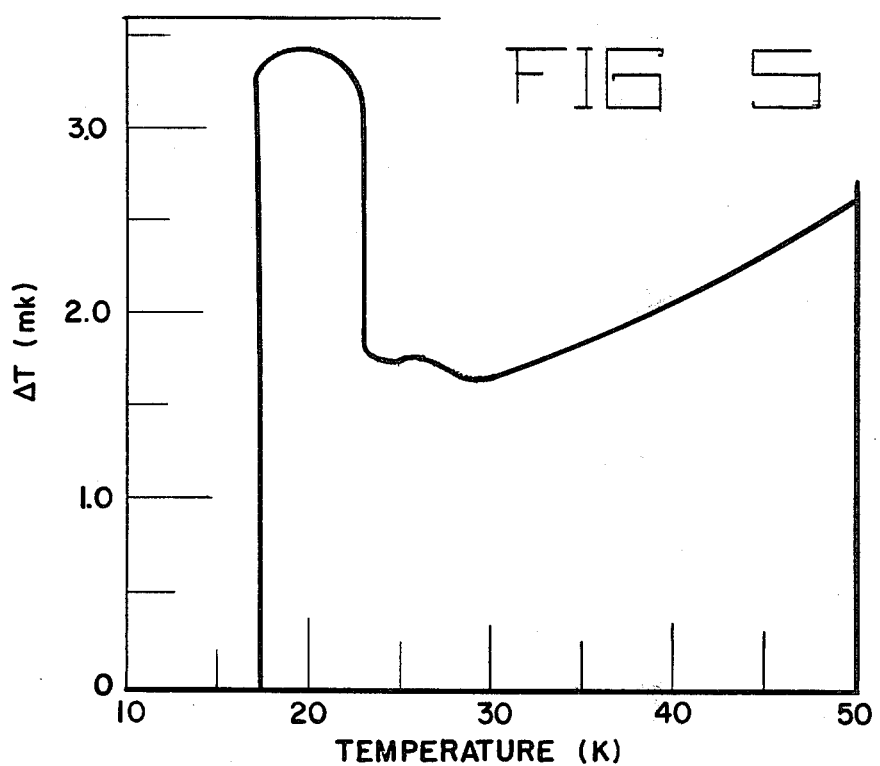
FIG. 5 shows the temperature dependent operation of a thermoelectric refrigerator according to the invention.

After measuring the thermoelectric power and electrical resistivity for $Nb_3Sn$ and $Nb_3Ge$, (see FIGS. 2 and 3), the figure of merit can be calculated, using thermal conductivity data for $Nb_3Sn$. It can be seen in FIG. 3, that the thermoelectric power, S, for the $Nb_3Sn$ sample and for each $Nb_3Ge$ sample tested, dropped to zero when the critical temperatures of those materials was passed. The thermal conductivity (resistivity) for $Nb_3Ge$ is assumed to be the same as for $Nb_3Sn$, and has not been measured, since the effect of the $Nb_3Ge$ vanishes below 23° K. Calculated values for Z are shown in FIG. 4. The maximum temperature drop in the refrigerator, T, calculated using the figures of merit, is shown in FIG. 5. As can be seen, $\Delta T$ drops abruptly to zero at the transition temperature of the $Nb_3Sn$.

This observed phenomenon can be used to stabilize the temperature of a refrigerator at the critical temperature of the $Nb_3Sn$ to better than 1 mK. (miledegree Kelvin). If the temperature of the cold junction rises above the critical temperature, the refrigerator turns itself on automatically and cools the cold junction. As soon as the critical temperature is reached, the refrigerator automatically shuts off. Thus, regulation to 1 mK. at 18° K. (1 part in 18,000) is possible. This is done without external regulation of any electrical parameter. A constant current is continuously passed through the refrigerator and the temperature dependence of the thermopower of the unit functions to control the refrigeration.

One example of the above described refrigerator was calculated for semiconductor elements 10 cm long, having rectangular cross-sectional dimensions 0.1 mm × 1000 Å. One practical problem encountered with such a refrigerator is whether it has sufficient cooling power to successfully operate a desired device. The device chosen for the study was a superconducting quantum interference device, or SQUID, dissipating a thermal power of $10^{-15}$ Watts at 30 MH$_z$. The cooling power of the refrigerator, $q_c$, must equal or exceed this thermal dissipation power.

$$q_c = (\alpha_2 - \alpha_1) I_\phi T_{cold} - \frac{I^2 R}{2} - K(T_{hot} - T_{cold})$$

where R is the resistance of the thermoelectric elements and $I\phi$ is the current through those elements.

$$R = \frac{L_1}{A_1 \sigma_1} + \frac{L_1}{A_2 \sigma_2} ;$$

$$K = \frac{A_1 K_1}{L_1} + \frac{A_2 K_2}{L_2}$$

where L is the length of the semiconductor element in question, A is its cross sectional area, and $\sigma$ is the conductivity per unit area.

Using the dimensions noted above:

$L_1 = L_2 = 10$ cm $A_1 = A_2 = 10^{-7}$ cm$^2$

From published conductivity tables:

$\sigma_1 = \sigma_2 = 5\ \mu\Omega-$ cm $K_1 = K_2 = 1 \times 10^{-3}$ W/cm-K

Substituting these values in the above equations for R, K yields:

$$R = \frac{10 \times 5 \times 10^{-6}}{10^{-7}} = 500 \Omega$$

$$K = \frac{10^{-7} \times 5 \times 10^{-3}}{10} = 1 \times 10^{-9} \, W/K$$

for a regulation to within 1 mK., $$T_h - T_c = 1 \, mK.$$

$I\phi$ can be solved using the following equation:

$$I_\phi = \frac{(\alpha_2 - \alpha_1)(T_h - T_c)}{R[(\sqrt{1 + Z T_m})-1]}$$

where $T_m = (T_c + T_h)/2 = 17$ and Z, from calculated values (FIG. 4), $= 2.3 \times 10^{-5}$
$I\phi = 2.2 \times 10^{-9}$ Amperes.

Solving for the cooling power of the refrigerator, $$q_c = 1.6 \times 10^{-12} - 1.2 \times 10^{-13} - 1 \times 10^{-12} \approx 5 \times 10^{-13} \, W.$$

It can therefore be seen that the cooling power of the refrigerator according to the invention is sufficient to operate the SQUID device in question.

The above arrangement of superconductors is one example of a first order control system, i.e. a system whose component materials have a necessary physical property which allows those materials to function as a thermoelectric refrigerator, the materials undergoing an infinite first derivative change in those properties with respect to temperature. However, other first order control systems may be used to practice the invention. Examples of such first order control systems include materials such as tetrathiafulvalenium - tetracyanoquinodimethianide (TTF-TCNQ) having first order metal - insulator transitions; and materials such as $BaTiO_3$ having a first order transition to the ferroelectric state.

Also, it will be recognized by those skilled in the art that different materials may be used for the superconductors described in a thermoelectric refrigerator system set forth above. Further, as is known in the art, the composition of those superconductors can be modified to provide a number of predetermined transition temperatures.

The embodiments of the invention in which an exclusive property or privilege is claimed are defined as follows:

1. A thermoelectric refrigerator having improved temperature stabilization means comprising:
first and second elements connected electrically in series and thermally in parallel, forming a cold junction and a hot junction;
means for passing an electrical current through said first and said second elements;
means for a thermally connecting said cold junction to an object to be refrigerated, and means for connecting said hot junction to a heat sink;
one of said first and said second elements having a first order change at a predetermined critical temperature above which said one of said first and said second elements functions as a thermoelectric refrigerator element and below which said one of said first and said second elements discontinuously ceases to function as a semiconductor thermoelectric refrigerator element whereby said thermoelectric refrigerator is thermally stabilized about said predetermined critical temperature.

2. The device of claim 1 wherein said first and said second elements comprise tetrathiafulvalenium-tetracyanoquinodimethanide.

3. The device of claim 1 wherein said first and said second elements comprise $BaTiO_3$.

4. A thermoelectric refrigerator having improved temperature stabilization means comprising:
first and second semiconductor thermoelectric refrigerator elements connected electrically in series and thermally in parallel, forming a cold junction and a hot junction;
means for passing an electrical current through said first and said second semiconductor thermoelectric refrigerator elements;
said first and said second semiconductor thermoelectric refrigerator elements further comprising first and second superconductors, each having a transition temperature respectively; and
means for a thermally connecting said cold junction to an object to be refrigerated, and means for connecting said hot junction to a heat sink.

5. The device of claim 4 further including means for maintaining said thermoelectric refrigerator in a cryogenic environment.

6. The device of claim 5 wherein said first and said second semiconductor thermoelectric refrigerator elements comprise $Nb_3Sn$ and $Nb_3Ge$ elements.

7. The device of claim 5 wherein said first and second semiconductor thermoelectric refrigerator elements comprise a first superconductor having a first critical temperature and a second superconductor having a lower critical temperature than said first critical temperature said refrigerator stabilized about the lower transition temperature of said second superconductor.

8. The device of claim 4 further comprising electronic amplifier means operable at a predetermined temperature which is stabilized by said thermoelectric refrigerator.

* * * * *